(12) United States Patent
Chiu et al.

(10) Patent No.: US 6,680,678 B2
(45) Date of Patent: Jan. 20, 2004

(54) CIRCUIT LAYOUT ARRANGEMENT FOR KEY SWITCH SIGNAL RECOGNITION

(75) Inventors: Chui-Kuei Chiu, Hsinchu Hsian (TW); Yin-Chun Huang, Hsinchu (TW)

(73) Assignee: Umax Data Systems, Inc., Hsinchu (TW)

( * ) Notice: Subject to any disclaimer, the term of this patent is extended or adjusted under 35 U.S.C. 154(b) by 417 days.

(21) Appl. No.: 09/777,828

(22) Filed: Feb. 7, 2001

(65) Prior Publication Data

US 2002/0140581 A1 Oct. 3, 2002

(51) Int. Cl.$^7$ .................... H03K 17/94; H03M 11/00
(52) U.S. Cl. .................. 341/22; 341/26; 400/477; 200/5 A
(58) Field of Search ............... 341/22, 26; 400/477; 200/5 A; 178/17 C

(56) References Cited

U.S. PATENT DOCUMENTS

| | | | | |
|---|---|---|---|---|
| 4,567,469 A | * | 1/1986 | Danish et al. ............... | 341/22 |
| 5,153,590 A | * | 10/1992 | Charlier ....................... | 341/31 |
| 5,534,860 A | * | 7/1996 | Phillips et al. ................ | 341/22 |
| 5,831,556 A | * | 11/1998 | Niot ............................. | 341/26 |

* cited by examiner

Primary Examiner—Timothy Edwards
(74) Attorney, Agent, or Firm—Rosenberg, Klein & Lee

(57) ABSTRACT

A key switch signal recognition circuit including a plurality of key switch buttons, a plurality of key switch signal output lines, and a plurality of key switch button contact areas is disclosed. Each of the key switch contact areas includes a first wire set and a second wire set. The first wire set has at least one wire, and each wire of the first wire set has one end connected to a common line and an opposite end forming an open end. The second wire set has at least one wire respectively disposed in parallel to and electrically insulated from the wire of the first wire set. The wire of the second wire set is respectively connected to a key switch signal output line. When depressing one key switch button to touch the corresponding key switch button contact area, the electrically conductive element of the depressed key switch button electrically connects the first wire set and second wire set of the touched key switch contact area, causing the respective key switch signal output line to send a key switch signal corresponding to the depressed key switch button.

5 Claims, 5 Drawing Sheets

CIRCUIT LAYOUT ARRANGEMENT FOR KEY SWITCH SIGNAL RECOGNITION

BACKGROUND OF THE INVENTION

1. Field of the Invention

The present invention relates to a key switch signal recognition circuit, and more particularly to a simple circuit layout of key switch signal recognition circuit.

2. Description of the Prior Art

Key switch circuits are intensively used in office automation equipment, industrial instrument, electric and electronic consumer products, and electric home appliances to serve as input interface means between the user and the machine. According to the conventional key switch circuit designs, one key switch button is matched with one circuit loop. The key switch buttons can be switches, micro switches, and membrane switches.

FIG. 1 shows a prior art switch button type key switch signal recognition circuit including a number of key switches. According to this design, a number of key switch contact areas may be arranged on a substrate 10 such as a printed circuit board, and a number of key switch buttons 11 are suspended above the key switch contact areas. Each key switch contact area is generally formed of two corresponding copper foil wires 12 and 13. One copper foil wire 12 is connected to a common point, such as a grounding terminal or a power source terminal. The other copper foil wire 13 is connected to a first connector 14. The pins of the first connector 14 are respectively connected through a cable 15 to a second connector 17 mounted on a circuit board 16. The second connector 17 of the circuit board 16 is further connected to a key switch signal reading interface 18 or a key switch signal processing circuit. According to this conventional key switch circuit design, a number of independent circuit loops are needed to transmit click signal from the key switch buttons, the cable 15 must have a number of wires, and the connectors 14 and 17 each must have a number of pins and one grounding wire. Further, when the numbers of the key switch button are changed, the model of the connector, the number of wires of the cable, and the number of pins of the key switch signal reading interface must be relatively changed.

In some key switch circuit designs, an encoder is used to achieve the object of using a limited number of wires to recognize a number of key switch buttons. However, the use of the encoder greatly increases the cost of the key switch circuit. Therefore, these conventional key switch circuit designs do not satisfy current market requirements. For example, in the design of a key switch circuit for a scanner, the factors of ease of use, highly expandability, less number of component parts, and lost cost must be taken into account.

Therefore, it is desirable to provide an improved key switch signal recognition circuit to mitigate and/or obviate the aforementioned problems.

SUMMARY OF THE INVENTION

Accordingly, the primary object of the present invention is to provide a key switch signal recognition circuit, which uses the architecture of a circuit layout to achieve accurate signal recognition of a number of key switch buttons, so that the number of key switch contact wires, the number of wires of the cable, and the number of pins of the related connector can be minimized.

It is another object of the present invention to provide a key switch signal recognition circuit, which uses a limited number of wires to achieve signal recognition of a number of key switch buttons. No signal encoder is required.

The present invention will be apparent to those skilled in the art by reading the following description of preferred embodiments thereof, with reference to the accompanying drawings, in which:

DETAILED DESCRIPTION OF THE PREFERRED EMBODIMENTS

Figure 1:
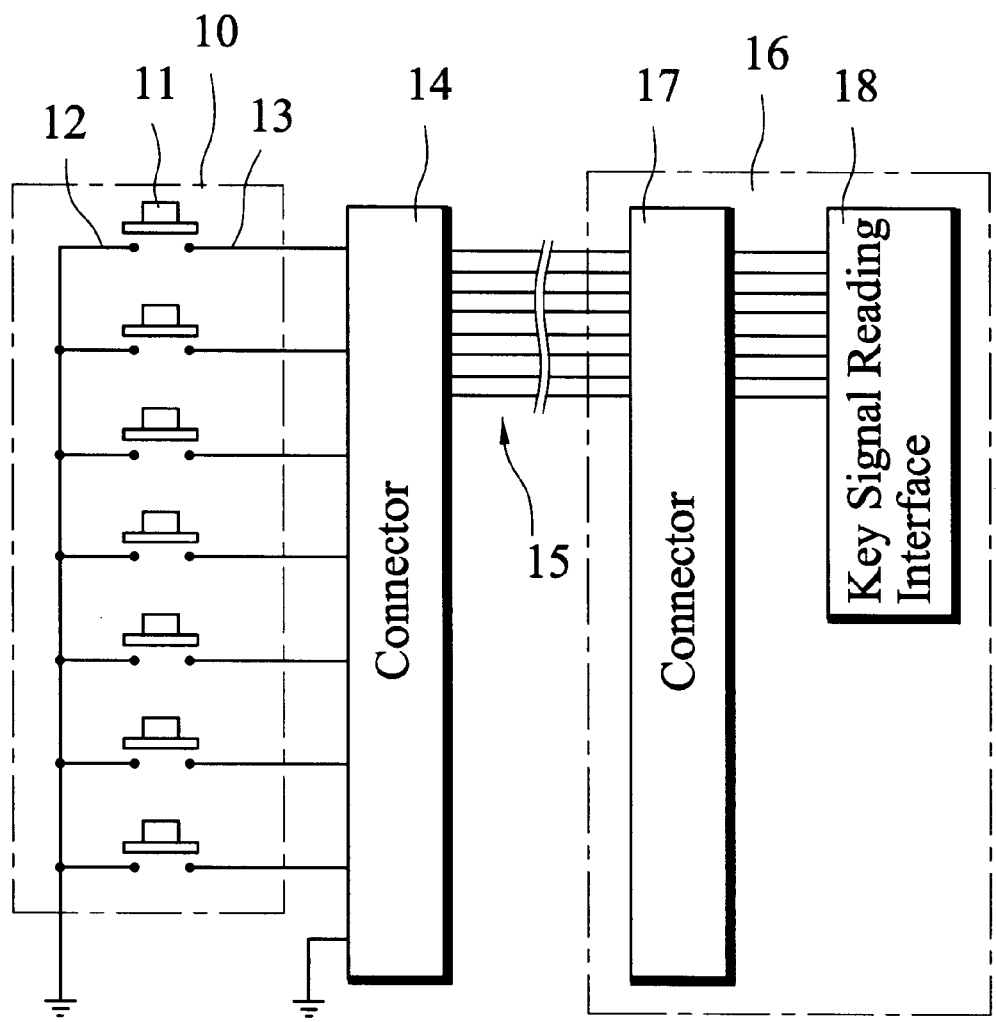
FIG. 1 illustrates a circuit diagram of a key switch signal recognition circuit according to the prior art.
Figure 2:
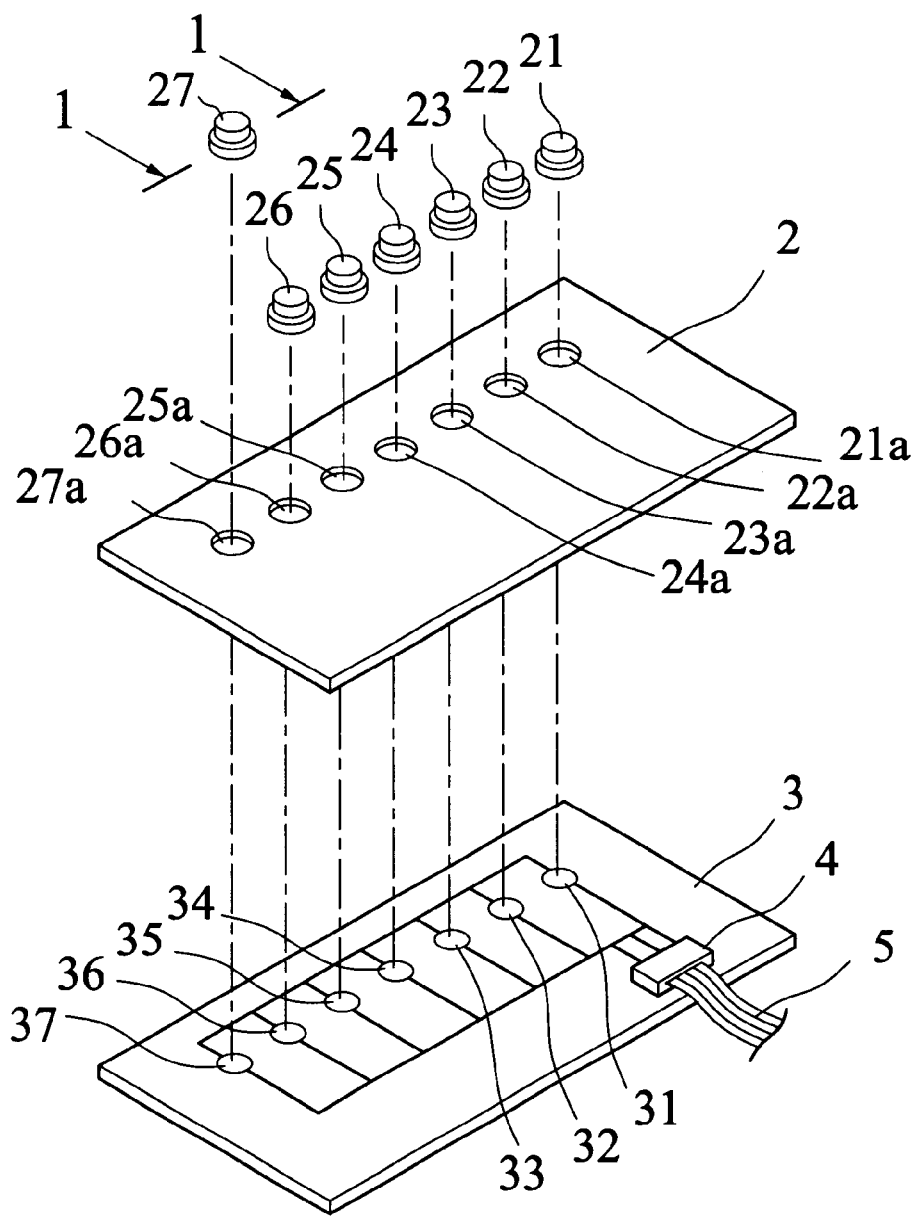
FIG. 2 is an exploded view of a key switch signal recognition circuit according to the present invention.
Figure 3:
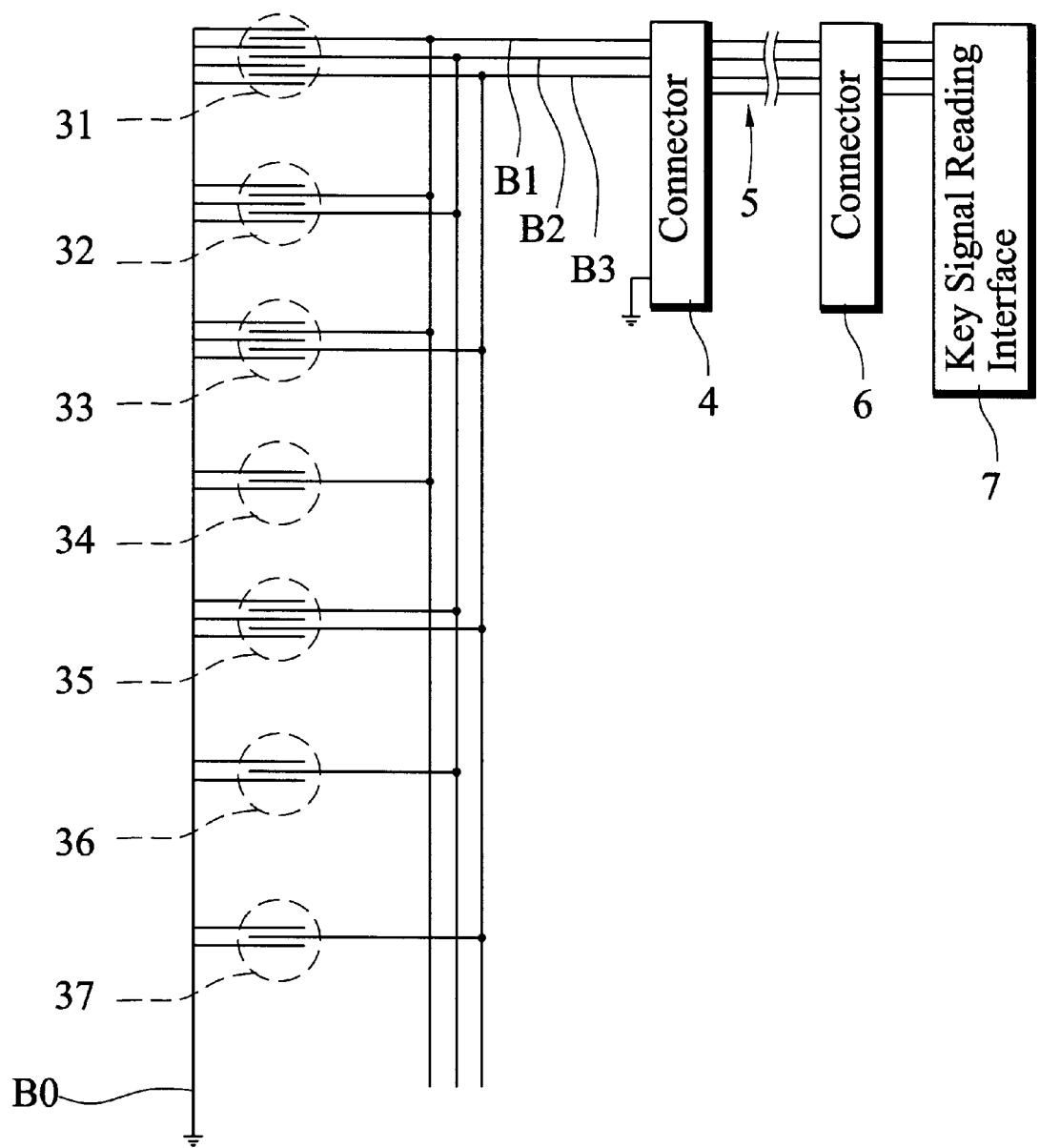
FIG. 3 shows a circuit layout in accordance with a first embodiment of the present invention.

FIG. 2 is an exploded view of the key switch signal recognition circuit of the present invention. FIG. 3 shows the circuit layout in accordance with the first embodiment of the present invention. As illustrated, the key switch signal recognition circuit comprises for example seven key switch buttons 21~27, and three keys witch signal output lines B1~B3.

Figure 4:
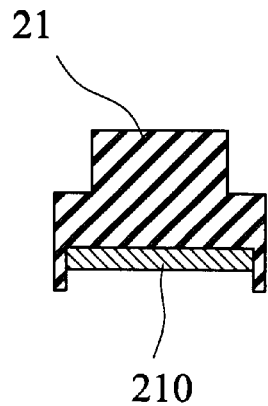
FIG. 4 is a cross sectional view of the key switch button taken along line 1—1 of FIG. 2.

Each key switch button is provided with an electrically conductive. FIG. 4 is a cross sectional view of the key switch button, taken along line 1—1 of FIG. 2, showing that an electrically conductive element 210 is mounted at the bottom side of the key switch button 21. The electrically conductive element 210 is preferably made of electrically conductive rubber.

During installation, the key switch buttons 21~27 are mounted in respective through holes 21a~27a arranged on a frame 2 corresponding to respective contact areas 31~37 arranged on a substrate 3 below the frame 2. A connector 4 is mounted on the substrate 3, having a set of pins respectively connected to the key switch signal output lines B1~B3.

When clicking either of the key switch buttons 21~27, the corresponding contact area of the substrate 3 is triggered to output a signal to the corresponding pin of the connector 4 through the key switch signal output line B1~B3.

According to the present design, each contact area of the substrate comprises a first wire set and a second wire set. The first wire set comprises at least one wire. Each wire of the first wire set has one end connected to a common line. The other end of each wire of the first wire set is an open end. The second wire set comprises at least one wire respectively disposed in parallel to and electrically insulated from the at least one wire of the first wire set. The other end of each wire of the second wire set is respectively connected to an assigned bit line, which is selected subject to a bit encoding mode. The bit-encoding mode can be known BCD code or any suitable encoding format.

Therefore, when depressing one key switch button to touch the corresponding contact area, the respective electrically conductive element electrically connects the first wire set and second wire set of the touched contact area, causing the respective key switch signal output line to send a key switch signal corresponding to the depressed key switch button.

As illustrated in FIG. 3, the wires of the first wire set (left-sided wires) of the first contact area 31 are connected to a common line B0. The second wire set (the right-sided wires) of the first contact area 31 includes three wires respectively connected to key switch signal output lines B1, B2 and B3. The right side of the first wire set of the first contact area 31 is an open side. The left side of the second wire set of the first contact area 31 is also an open side. The wires of the first wire set of the first contact area 31 are disposed in parallel to and electrically insulated from the wires of the second wire set of the first contact area 31.

The wires of the first wire set (left-sided wires) of the second contact area 32 are connected to the aforesaid common line B0. The second wire set (the right-sided wires) of the second contact area 32 includes two wires respectively connected to the first, second and third key switch signal output lines B1 and B2. The wires of the first wire set of the second contact area 32 are disposed in parallel to and electrically insulated from the wires of the second wire set of the second contact area 32.

The wires of the first wire set (left-sided wires) of the third contact area 33 are connected to the aforesaid common line B0. The second wire set (the right-sided wires) of the third contact area 33 includes two wires respectively connected to the first and third key switch signal output lines B1 and B3. The wires of the first wire set of the third contact area 33 are disposed in parallel to and electrically insulated from the wires of the second wire set of the third contact area 33.

The wires of the first wire set (left-sided wires) of the fourth contact area 34 are connected to the aforesaid common line B0. The second wire set (the right-sided wires) of the fourth contact area 34 includes one wire connected to the first key switch signal output line B1. The wires of the first wire set of the fourth contact area 34 are disposed in parallel to and electrically insulated from the wires of the second wire set of the fourth contact area 34.

The wires of the first wire set (left-sided wires) of the fifth contact area 35 are connected to the aforesaid common line B0. The second wire set (the right-sided wires) of the fifth contact area 35 includes two wires respectively connected to the second and third key switch signal output lines B2 and B3. The wires of the first wire set of the fifth contact area 35 are disposed in parallel to and electrically insulated from the wires of the second wire set of the fifth contact area 35.

The wires of the first wire set (left-sided wires) of the sixth contact area 36 are connected to the aforesaid common line B0. The second wire set (the right-sided wires) of the sixth contact area 36 includes one wire connected to the second key switch signal output line B2. The wires of the first wire set of the sixth contact area 36 are disposed in parallel to and electrically insulated from the wires of the second wire set of the sixth contact area 36.

The wires of the first wire set (left-sided wires) of the seventh contact area 37 are connected to the aforesaid common line B0. The second wire set (the right-sided wires) of the seventh contact area 37 includes one wire connected to the third key switch signal output lines B3. The wires of the first wire set of the seventh contact area 37 are disposed in parallel to and electrically insulated from the wires of the second wire set of the seventh contact area 37.

Subject to the aforesaid circuit layout, a bit definition table illustrating the relation between the key switch buttons and the bit codes for key switch signal recognition is obtained as shown in TABLE 1:

TABLE 1

| Key switch | Bit definition | | |
|---|---|---|---|
| | B1-bit | B2-bit | B3-bit |
| 7 | 0 | 0 | 0 |
| 6 | 0 | 0 | 1 |
| 5 | 0 | 1 | 0 |
| 4 | 0 | 1 | 1 |
| 3 | 1 | 0 | 0 |
| 2 | 1 | 0 | 1 |
| 1 | 1 | 1 | 0 |

It is noted that the present invention requires only three bit lines (key switch signal output lines B1, B2, B3) for recognizing signals from the seven key switch buttons 21~27 without the use of any encoding circuit or encoder.

In actual practice, the key switch signal output lines B1, B2 and B3 are connected to the respective pins of the connector 4, and the connector 4 is connected to a cable 5. According to the preferred embodiment of the present invention, the cable 5 comprises three signal lines and one grounding line. A second connector 6 is used to connect the cable 5 to a circuit board or signal-reading interface 7.

Figure 5:
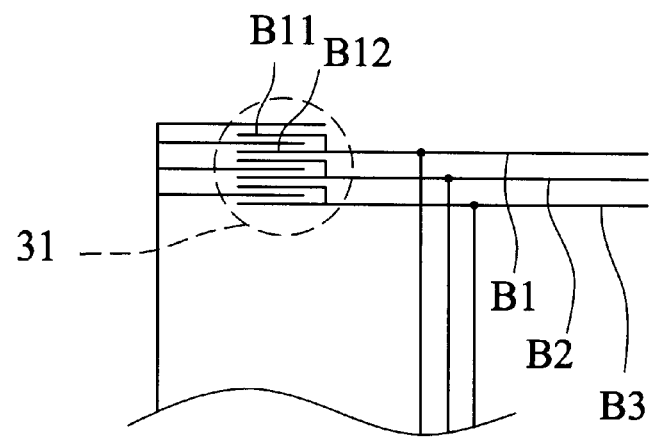
FIG. 5 is a circuit layout of a second embodiment of the present invention.

FIG. 5 shows a second embodiment of the present invention. According to this embodiment, the wires of the first wire set (left-sided wires) of the first contact area 31 are connected to the common line B0, the three wires of the second wire set (right-sided wires) of the first contact area 31 each has one end respectively connected to the first, second and third key switch signal output lines B1, B2 and B3 and an opposite end terminating in two parallel end portions B11 and B12 disposed in parallel to and electrically insulated from the wires of the first wire set of the first contact area 31.

Figure 6:
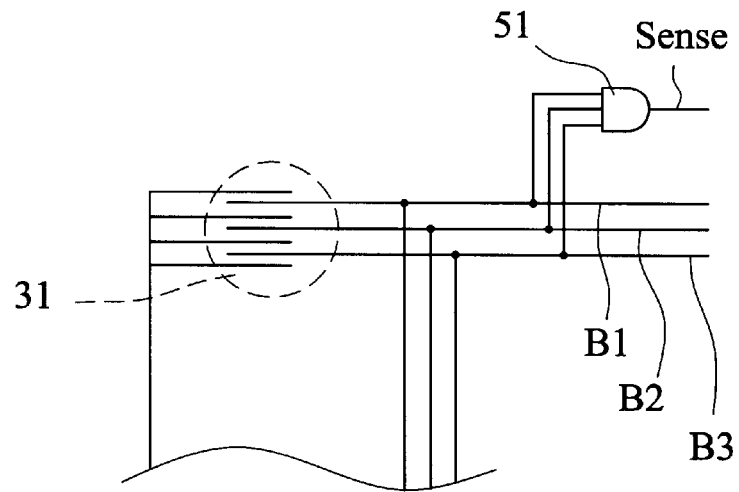
FIG. 6 is a circuit layout of a third embodiment of the present invention, showing the key switch signal output lines respectively connected to an input of an AND gate.

FIG. 6 shows a third embodiment of the present invention. According to this embodiment, the first, second and third key switch signal output lines B1, B2 and B3 are respectively connected to the signal input end of a respective AND gate 51. The AND gate 51 is induced to output a triggering signal Sense to the key switch signal reading circuit (not shown) when the corresponding key switch signal output line B1, B2 or B3 is logically high.

Figure 7:
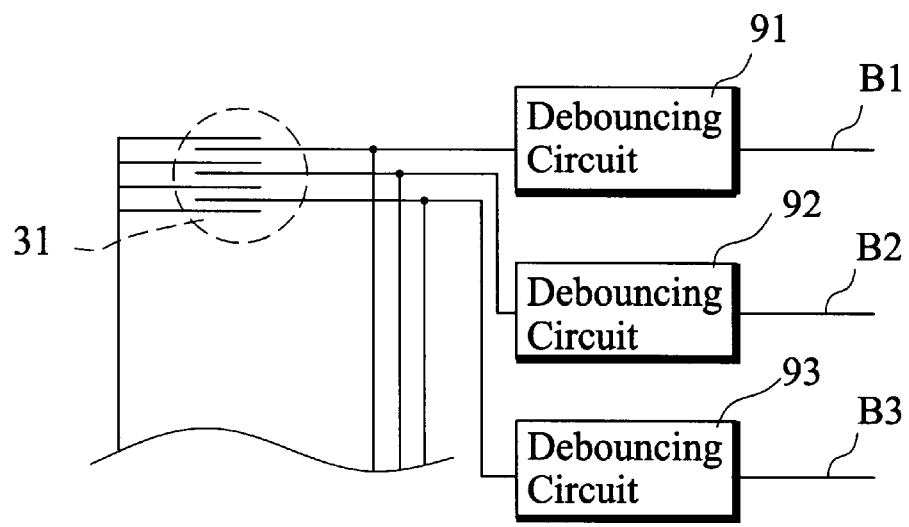
FIG. 7 is a circuit layout of a fourth embodiment of the present invention showing each of the key switch signal output lines is further connected with a debouncing circuit.

FIG. 7 shows a fourth embodiment of the present invention. According to this embodiment, the first, second and third key switch signal output lines B1, B2 and B3 are respectively connected to respective debouncing circuits 91, 92 and 93 capable of preventing the respective key switch signal output line to output an unstable signal at the initial stage when the respective key switch button is depressed.

Although the present invention has been described with reference to the preferred embodiments, it is apparent to those skilled in the art that a variety of modifications and changes may be made without departing from the scope of the present invention which is intended to be defined by the appended claims.

What is claimed is:

1. A key switch signal recognition circuit comprising:
   a plurality of key switch buttons, said key switch buttons each provided with an electrically conductive element;
   a plurality of key switch key signal output lines;
   an AND gate having an output and a plurality of inputs respectively connected to said plurality of key switch key signal output lines; and a plurality of contact areas arranged on a substrate corresponding to said key switch buttons, said contact areas each comprising a first wire set and a second wire set, said first wire set comprising at least one wire having one end connected to a common line and an opposite end forming an open end, said second wire set comprising at least one wire respectively disposed in parallel to and electrically insulated from the wire of said first wire set, the wire of said second wire set being respectively connected to the key switch signal output line which is selected subject to a predetermined bit encoding mode;

when one of said key switch buttons is depressed to touch the corresponding contact area, the electrically conductive element of the depressed key switch button electrically connects the first wire set and second wire set of the touched contact area, causing the respective key switch signal output line to send a key switch signal corresponding to the depressed key switch button, said output of said And gate outputting a triggering signal responsive to the key switch signal output line of a corresponding contact area is at a logically high level.

2. The key switch signal recognition circuit of claim 1, wherein said bit encoding mode is a BCD encoding format.

3. The key switch signal recognition circuit of claim 1, wherein said key switch signal output lines comprises a grounding wire.

4. The key switch signal recognition circuit of claim 1, wherein the open end of the wire of the first wire set and the second wire set is terminated into two parallel end portions.

5. The key switch signal recognition circuit of claim 1, wherein the key switch signal output lines are further respectively connected to a debouncing circuit.

* * * * *